(12) United States Patent
Jung et al.

(10) Patent No.: US 7,759,858 B2
(45) Date of Patent: Jul. 20, 2010

(54) DISPLAY DEVICE AND METHOD THEREOF

(75) Inventors: Kwang-chul Jung, Seongnam-si (KR); Beohm-rock Choi, Seoul (KR); Joon-chul Goh, Seoul (KR); Young-soo Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 309 days.

(21) Appl. No.: 11/769,885

(22) Filed: Jun. 28, 2007

(65) Prior Publication Data
US 2008/0036388 A1     Feb. 14, 2008

(30) Foreign Application Priority Data
Aug. 11, 2006   (KR) ...................... 10-2006-0076336

(51) Int. Cl.
*H01J 1/64*   (2006.01)
*H01J 1/63*   (2006.01)
*G09G 3/12*   (2006.01)
*H01L 51/50*  (2006.01)

(52) U.S. Cl. .................... 313/504; 313/512; 315/169.3; 257/79

(58) Field of Classification Search ......... 349/149–152; 345/76, 80; 257/79; 313/504, 512
See application file for complete search history.

(56) References Cited

U.S. PATENT DOCUMENTS 7,230,593 B2 *   6/2007   Nakanishi ..................... 345/80

2006/0208657 A1 *   9/2006   Hara et al. ................ 315/169.3
2007/0046606 A1 *   3/2007   Kim et al. ..................... 345/90
2007/0252790 A1 *   11/2007   Jung et al. ..................... 345/76
2008/0001940 A1 *   1/2008   Koh et al. .................... 345/211

FOREIGN PATENT DOCUMENTS

| EP | 1575090 | * | 9/2005 |
| KR | 10-2005-0013874 | * | 2/2005 |
| KR | 1020050013874 | | 2/2005 |
| KR | 1020060001378 | | 1/2006 |
| KR | 1020060032089 | | 4/2006 |

* cited by examiner

*Primary Examiner*—Karabi Guharay
*Assistant Examiner*—Sheryl Hull
(74) *Attorney, Agent, or Firm*—Cantor Colburn LLP (57) ABSTRACT

A display device includes an insulating substrate having a display region formed with a display unit, a wire having power supply, data, and gate lines, a circuit board connected to a first edge of the substrate parallel to the gate line and supplying common and driving voltages to the display unit, a driving voltage supplying part provided between a second edge opposite the first edge and the display region, and connected to the power supply line, a driving voltage transmitting part connecting the circuit board to the driving voltage supplying part, and a common voltage supplying part formed between the circuit board and the display region supplying the common voltage to the display unit.

23 Claims, 12 Drawing Sheets

DISPLAY DEVICE AND METHOD THEREOF

This application claims priority to Korean Patent Application No. 2006-0076336, filed on Aug. 11, 2006 and all the benefits accruing therefrom under 35 U.S.C. §119, and the contents of which in its entirety are herein incorporated by reference.

BACKGROUND OF THE INVENTION

1. Field of the Invention

The present invention relates to a display device and a method thereof. More particularly, the present invention relates to a display device supplying a common voltage and a driving voltage thereto, and a method of limiting a non-display region of the display device.

2. Description of the Related Art

In recent years, an organic light emitting diode ("OLED") display device among display devices has come into the spot light because of its low driving voltage, light slim shape, wide view angle, and fast response time.

The OLED display device includes an organic light emitting layer and generates a light by receiving electrons and holes from a pixel electrode and a common electrode. The common electrode is formed on an entire display area after forming the organic light emitting layer. The light emitting layer is susceptible to deterioration from heat and thus manufacturing conditions to form the common electrode are restricted. The common electrode should be formed transparent in the case of top emission type of display device. Accordingly, forming the common electrode with low electrical resistance is not easy.

The OLED display device includes a power supply line and a driving voltage is applied to the power supply line.

The driving voltage is supplied to the power supply line and a common voltage is supplied to the common electrode, leading to a complicated OLED display device structure and widening a non-display region of the display device.

BRIEF SUMMARY OF THE INVENTION

Accordingly, it is an aspect of the present invention to provide a display device supplying a common voltage and a driving voltage without an increase of a non-display region. It is a further aspect of the present invention to provide a method of limiting an area of a non-display region of a display device while supplying the common voltage and the driving voltage to the display device.

The foregoing and/or other aspects of the present invention can be achieved by providing exemplary embodiments of a display device including an insulating substrate having a display region formed with a display unit and an encapsulating substrate facing the insulating substrate, the display device further including a wire including a power supply line, a data line, and a gate line, a circuit board connected to a first edge of the insulating substrate, extending substantially parallel to the gate line, and the circuit board supplying a common voltage and a driving voltage to the display unit, a driving voltage supplying part provided between a second edge of the insulating substrate, opposite to the first edge, and the display region, and the driving voltage supplying part connected to the power supply line, a driving voltage transmitting part formed along a periphery of the display region, connected to the circuit board through one side thereof and connected to the driving voltage supplying part through another side thereof, and a common voltage supplying part formed between the circuit board and the display region, the common voltage supplying part supplying the common voltage from the circuit board to the display unit.

The display device may further include an adhesion member disposed between the insulating substrate and the encapsulating substrate wherein at least a portion of the driving voltage transmitting part and at least a portion of the driving voltage supplying part are disposed between the adhesion member and the insulating substrate. At least a portion of the adhesion member may be formed along the periphery of the display region, and the adhesion member may be extended over the display unit.

The display device may further include a gate driving part connected to the gate line and attached to the insulating substrate outside of a region occupied by the adhesion member.

The driving voltage transmitting part may include a first sub driving voltage transmitting part adjacent one side of the display region and a second sub driving voltage transmitting part adjacent an opposite side of the display region, leaving the display region disposed between the first sub driving voltage transmitting part and the second sub driving voltage transmitting part.

The driving voltage transmitting part and the driving voltage supplying part may be integrally formed, and may be formed on a same layer of the display device. The common voltage supplying part and the gate line may be formed on a same layer of the display device.

At least a portion of the common voltage supplying part may be extended lengthwise to cross the data line.

The display device may further include a gate driving part connected to the gate line, wherein at least a portion of the gate driving part is disposed between the driving voltage transmitting part and the display region. The display device may further include a plurality of gate lines, and gate driving part may include a first sub gate driving part connected with a first set of the gate lines and a second sub gate driving part connected with a remaining set of the gate lines, wherein the first sub gate driving part and the second sub gate driving part are provided adjacent opposite sides of the display region, leaving the display region disposed between the first sub gate driving part and the second sub gate driving part.

The gate driving part may be formed on the insulating substrate.

The display device may further include a data driving part attached to the insulating substrate between the display region and the first edge of the insulating substrate.

The encapsulating substrate may include one of glass and stainless steel.

The foregoing and/or other aspects of the present invention can also be achieved by providing a display device including an insulating substrate having a display region formed with a display unit and an encapsulating substrate facing the insulating substrate, the display device including a circuit board connected to the insulating substrate and supplying a driving signal, a common voltage, and a driving voltage to the display unit, a common voltage supplying part disposed adjacent to the circuit board and supplying the common voltage from the circuit board to the display unit, and a driving voltage supplying part facing the common voltage supplying part and supplying the driving voltage from the circuit board to the display unit, the display region disposed between the driving voltage supplying part and the common voltage supplying part.

The display device may further include an adhesion member disposed between the insulating substrate and the encapsulating substrate, wherein at least a portion of the driving voltage supplying part is disposed between the adhesion member and the insulating substrate.

The foregoing and/or other aspects of the present invention can also be achieved by providing a method of limiting an area of a non-display region of a display device while supplying a common voltage and a driving voltage to the display device, the display device having an insulating substrate having a display region formed with a display unit, the method including providing a common voltage supplying part on the insulating substrate adjacent a first side of the display region, the common voltage supplying part supplying the common voltage to the display unit, and providing a driving voltage supplying part on the insulating substrate adjacent a second side of the display region, the second side opposite the first side, the driving voltage supplying part supplying the driving voltage to the display unit, wherein the display region is disposed between the common voltage supplying part and the driving voltage supplying part.

The display device may further include an encapsulating substrate facing the insulating substrate, and the method may further include disposing an adhesion member between the insulating substrate and the encapsulating substrate and at least partially covering the driving voltage supplying part with the adhesion member.

The method may further include connecting a first end of a driving voltage transmitting part to the driving voltage supplying part, and connecting a second end of the driving voltage transmitting part to a circuit board disposed adjacent the first side of the display region, wherein the circuit board provides the common voltage to the common voltage supplying part and provides the driving voltage to the driving voltage supplying part.

BRIEF DESCRIPTION OF THE DRAWINGS

The above and/or other aspects, features, and advantages of the present invention will become apparent and more readily appreciated from the following description of the exemplary embodiments, taken in conjunction with the accompanying drawings of which.

DETAILED DESCRIPTION OF THE INVENTION

Reference will now be made in detail to exemplary embodiments of the present invention, examples of which are illustrated in the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

A same reference number is allocated to a same element for different embodiments. The same element may be representatively explained only in a first embodiment and omitted in subsequent embodiments.

If a first film (layer) or element is 'on' a second film (layer) or element, third films (layers) or elements may be interposed between the first and the second films (layers) or elements or the first and the second films (layers) or elements may contact directly. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 1:
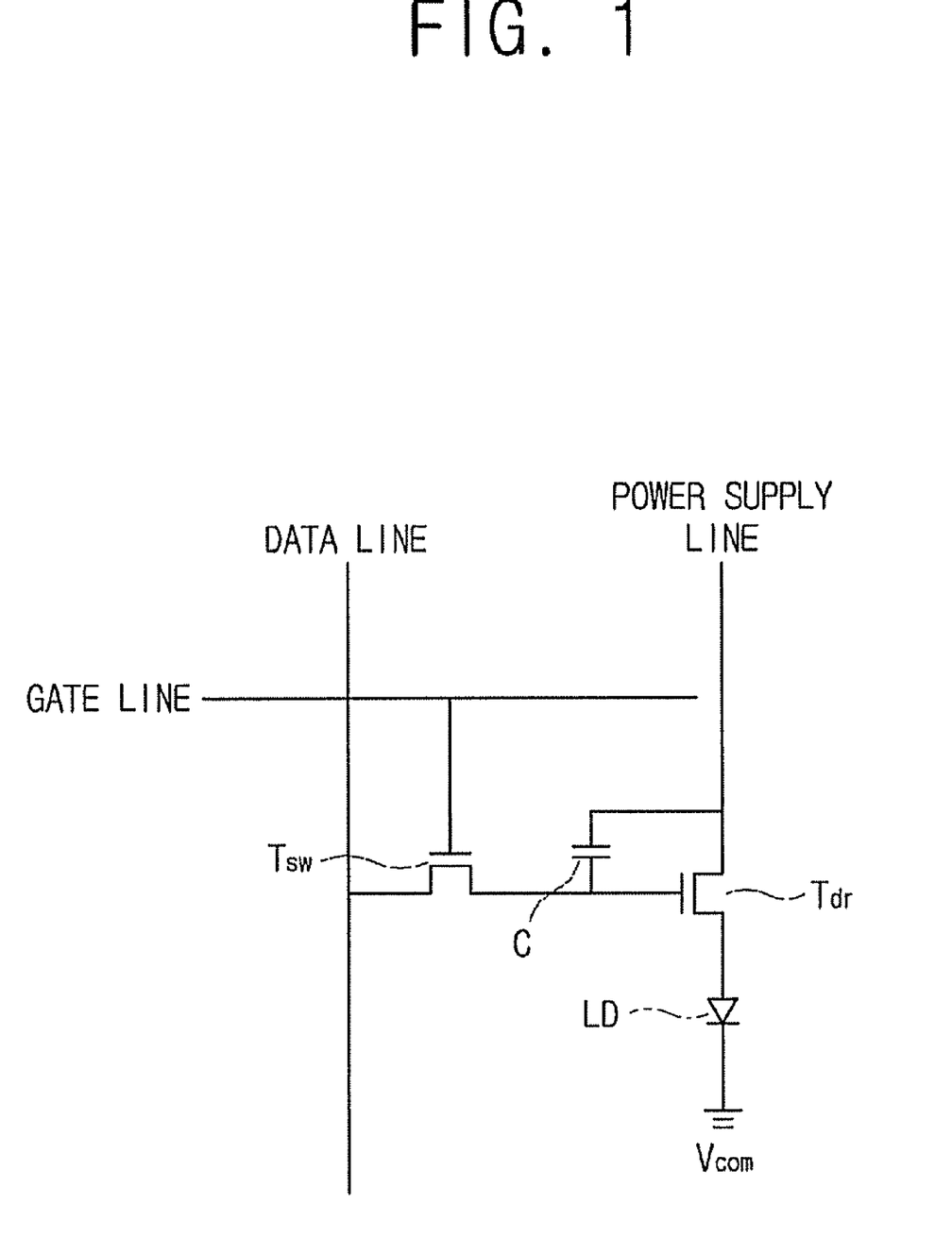
FIG. 1 is a circuit diagram of an exemplary pixel area according to a first exemplary embodiment of the present invention.

FIG. 1 is a circuit diagram for an exemplary pixel according to a first exemplary embodiment of the present invention.

A plurality of signal wires is provided for each pixel. The signal wire include a gate line transmitting a scanning signal, a data line transmitting a data signal, and a power supply line transmitting a driving voltage. The gate line, data line, and power supply line may be collectively described as the wire of the display device. The data line extends adjacent to the power supply line and the data line and the power supply line are arranged parallel or substantially parallel to each other. The gate line is extended perpendicular or substantially perpendicular to the data line and the power supply line.

Each pixel includes a light emitting diode LD, a switching thin film transistor ("TFT") Tsw, a driving TFT Tdr, and a capacitor C.

The driving TFT Tdr has a control terminal, an input terminal, and an output terminal. The control terminal, such as a gate electrode, is connected to the switching TFT Tsw, the input terminal, such as a source electrode, is connected to the power supply line, and the output terminal, such as a drain electrode, is connected to the light emitting diode LD.

The light emitting diode LD has an anode connected to the output terminal of the driving TFT Tdr and a cathode connected to a common voltage. The light emitting diode LD displays an image by emitting light differently according to an output current amount of the driving TFT Tdr. The current of the driving TFT Tdr changes according to a voltage applied between the control and output terminals of the driving TFT Tdr.

The switching TFT Tsw also has a control terminal, an input terminal, and an output terminal. The control terminal, such as a gate electrode, is connected to the gate line, the input terminal, such as a source electrode, is connected to the data line, and the output terminal, such as a drain electrode, is connected to the control terminal of the driving TFT Tdr. The switching TFT Tsw transmits a data signal, applied from the data line by the scanning signal supplied to the gate line, to the driving TFT Tdr.

The capacitor C is disposed between the control terminal and the input terminal of the driving TFT Tdr, and connects the control terminal and the input terminal of the driving TFT Tdr. The capacitor C is charged with the data signal inputted from the control terminal of the driving TFT Tdr and maintains its charged state.

Figure 2:
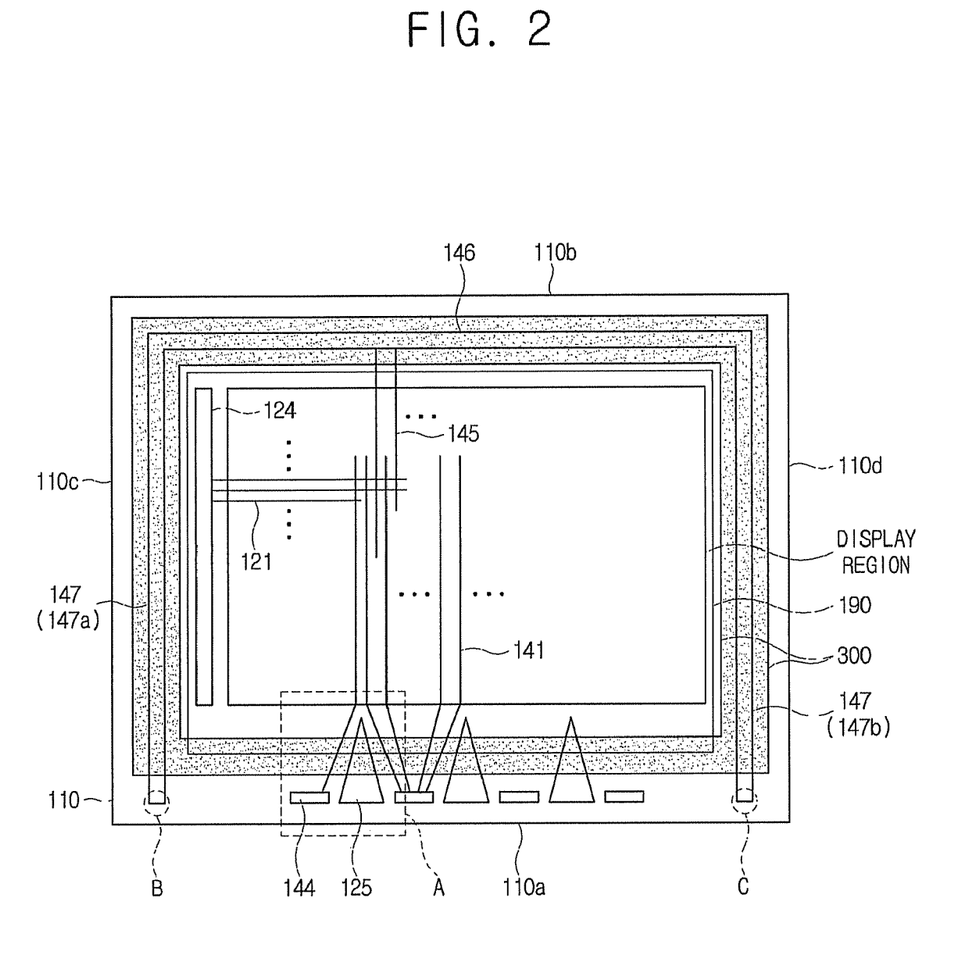
FIG. 2 and FIG. 3 show schematic top layout views of an exemplary display device according to the first exemplary embodiment of the present invention.
Figure 3:
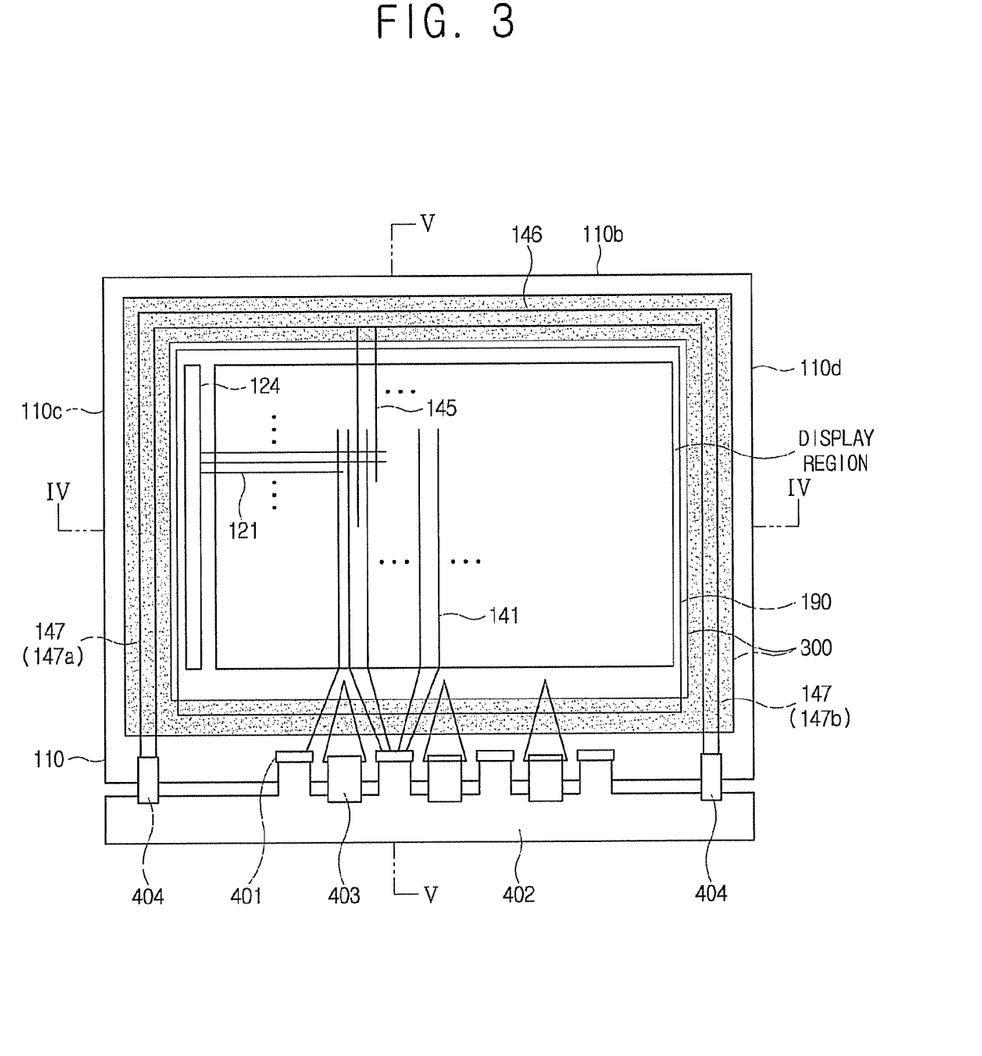

A display device according to the first exemplary embodiment of the present invention is described with reference to FIG. 2 through FIG. 5. FIG. 2 and FIG. 3 show schematic top layout views of the exemplary display device according to the first exemplary embodiment of the present invention. FIG. 2 shows the display device with a circuit board, a data driving part, and a power transmitting film removed therefrom. The circuit board, data driving part, and power transmitting film are shown in FIG. 3 as will be further described below.

An insulating substrate 110 includes a display region of a rectangular shape and a non-display region surrounding the display region. The insulating substrate 110 has nearly a rectangular shape with first through fourth edges 110a, 110b, 110c, and 110d. While a particular shape is described, other shapes may also be within the scope of these embodiments.

A display unit is formed on the display region of the insulating substrate 110. A gate driving part 124 and a data driving part 401 are disposed within the non-display region at an outer edge of the display region, a common voltage supplying part 125 is disposed within the non-display region and adjacent a lower part, or first portion, of the display region and a driving voltage supplying part 146 is disposed within the non-display region adjacent an upper part, or second portion opposite the first portion, of the display region. A pair of driving voltage transmitting parts 147, flanking the display region there between, are provided in the non-display region and connected to the driving voltage supplying part 146. The driving voltage transmitting parts 147 may be formed adjacent third and fourth opposite portions of the display region.

The common voltage supplying part 125 and the driving voltage supplying part 146 are supplied with a common voltage and a driving voltage, respectively, from the circuit board 402.

Figure 5:
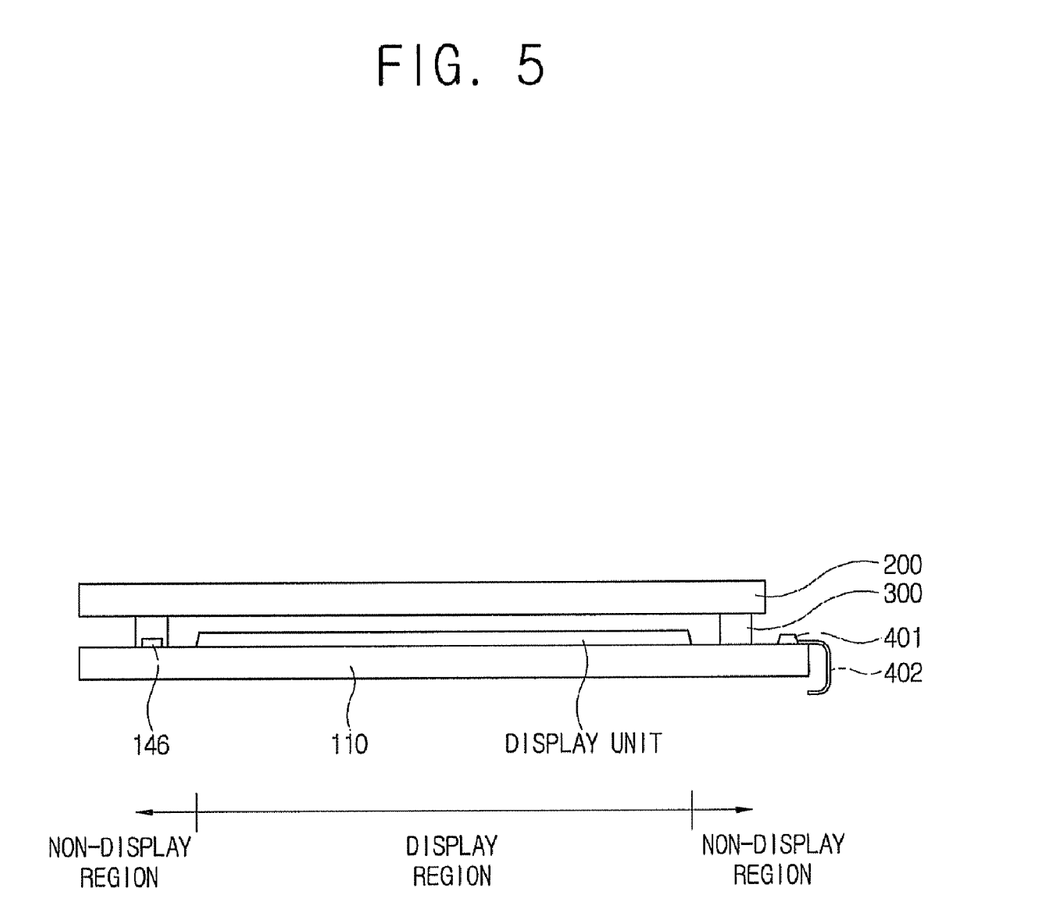
FIG. 5 shows a cross sectional view taken along line V-V of FIG. 3.

An encapsulating substrate 200, as shown in FIG. 5, faces the insulating substrate 110. The insulating substrate 110 and the encapsulating substrate 200 are coupled through an adhesion member 300 formed in the non-display region along a periphery of the display region.

Figure 4:
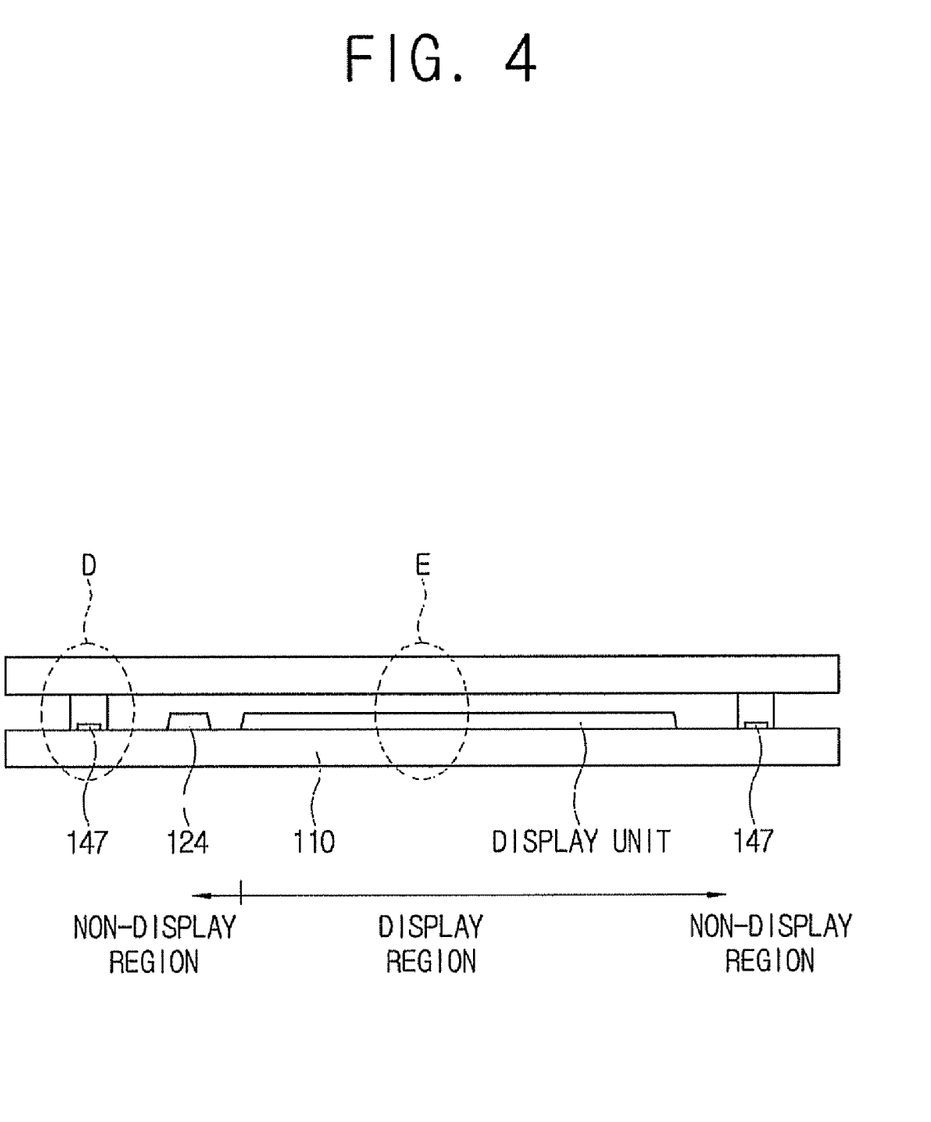
FIG. 4 shows a cross sectional view taken along line IV-IV of FIG. 3.

As further shown in FIG. 5, the driving voltage supplying part 146 is formed between the insulating substrate 110 and the adhesion member 300. As shown in FIG. 4, the gate driving part 124 is disposed inside of the adhesion member 300 and as shown in FIG. 5, the data driving part 401 is disposed outside of the adhesion member 300. In other words, the gate driving part 124 is disposed within a periphery of an area defined by the adhesion member 300, the driving part 401 is disposed outside of the periphery of the area defined by the adhesion member 300, and the driving voltage supplying part 146 is disposed along the periphery of the adhesion member 300.

Hereinafter, a configuration of the display device is further described in detail by differentiating the non-display region and the display region.

First, the non-display region is described.

Referring to FIGS. 2 and 3, a data pad 144 connected to a data driving part 401 is provided in the non-display region along a first edge 110a of the insulating substrate 110. The data pad 144 makes contact with a data line 141 extended into the display region.

A group of the data pads 144 are provided in plural and each group of the data pads 144 is separated from an adjacent group of the data pads 144 by a regular distance. The common voltage supplying part 125 is disposed between two adjacent groups of the data pads 144. As shown in FIG. 3, the common voltage supplying part 125 receives the common voltage from the circuit board 402 through a common voltage transmitting film 403.

The common voltage supplying part 125 is provided in plural, and the common voltage supplying part 125 is separated by a regular distance from an adjacent common voltage supplying part 125 and supplies the common voltage to a common electrode 190.

Figure 6:
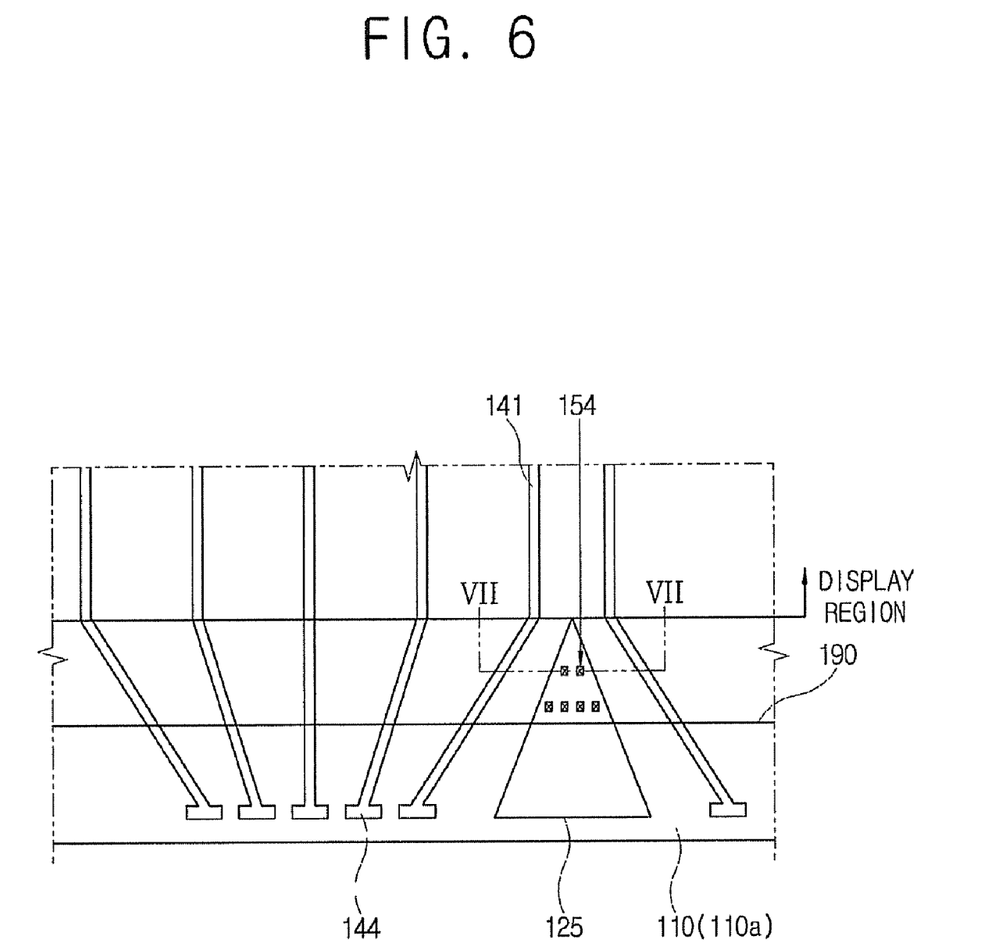
FIG. 6 is an enlarged view of portion 'A' in FIG. 2.
Figure 7:
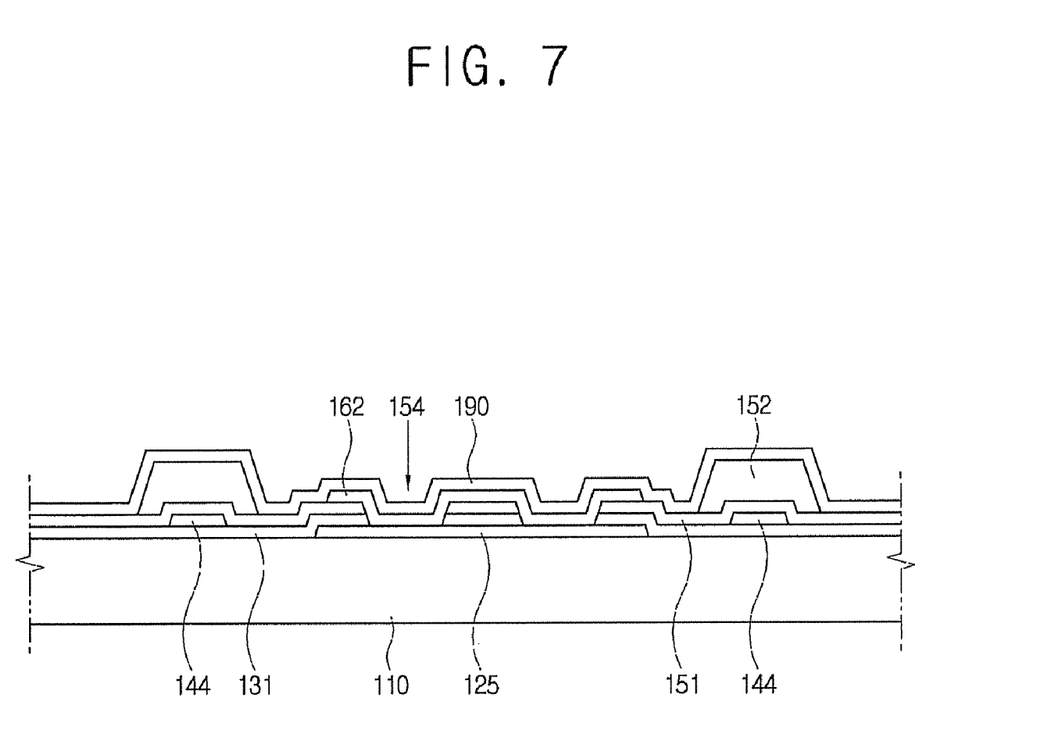
FIG. 7 shows a cross sectional view taken along line VII-VII of FIG. 6.

The common voltage supplying part 125 is further described with reference to FIG. 6 and FIG. 7.

The common voltage supplying part 125 is formed on a layer different from a layer where the data line 141 is formed but on the same layer where a gate line 121 is formed. For example, the common voltage supplying part 125 and the gate line 121 may be formed on the insulating substrate 110, and the data line may be formed on a gate insulating layer 131, which is formed on the common voltage supplying part 125, the gate line 121, and exposed portions of the insulating substrate 110. The common voltage supplying part 125 is disposed between adjacent groups of data pads 144. A contact hole 154 is formed on the common voltage supplying part 125 by removing a portion of the gate insulating layer 131 and a passivation layer 151. A portion of the common voltage supplying part 125 exposed by the contact hole 154 is covered with a contact member 162 including transparent conductive material. The common electrode 190 receives the common voltage from the common voltage supplying part 125 through the contact member 162.

While it has been described that the common voltage supplying part 125 and the data line 141 are formed in different layers of the display device, in alternative embodiments, the common voltage supplying part 125 and the data line 141 may be formed on a same layer of the display device.

The driving voltage supplying part 146 is formed parallel or substantially parallel with the gate line 121, and is formed on the non-display region above the display region, namely, on the non-display region along a second edge 110b of the insulating substrate 110. In other words, the driving voltage supplying part 146 is formed adjacent a second portion of the display region. The driving voltage supplying part 146 is formed on a same layer within the display device as the data line 141 and formed as one body, such as integrally, with a power supply line 145, although alternate embodiments having differing configurations may also be within the scope of these embodiments. The driving voltage supplying part 146 is disposed in the region occupied by the adhesion member 300, that is, the adhesion member 300 is formed on the voltage supplying part 146 to cover the voltage supplying part 146.

The gate driving part 124 and a first sub driving voltage transmitting part 147a are disposed on the non-display region left of the display region, namely, on the non-display region along a third edge 110c of the insulating substrate 110.

The gate driving part 124 is disposed between the display region and the adhesion member 300. The gate driving part 124 applies a gate driving signal, such as a gate on voltage or a gate off voltage, to the gate line 121. The driving part 124 receives the gate driving signal from the circuit board 402 through a connecting wire (not shown) on the insulating substrate 110 connecting the gate driving part 124 and the circuit board 402.

The gate driving part 124 may also be called a shift register and is formed on the insulating substrate 110 when the display unit is formed.

The first sub driving voltage transmitting part 147a may be formed integrally with the driving voltage supplying part 146 and extends parallel or substantially parallel to the data line 141. As shown in FIGS. 2 and 3, an end portion 'B' of the first sub driving voltage transmitting part 147a is connected to the circuit board 402 through a driving voltage transmitting film 404.

Figure 8:
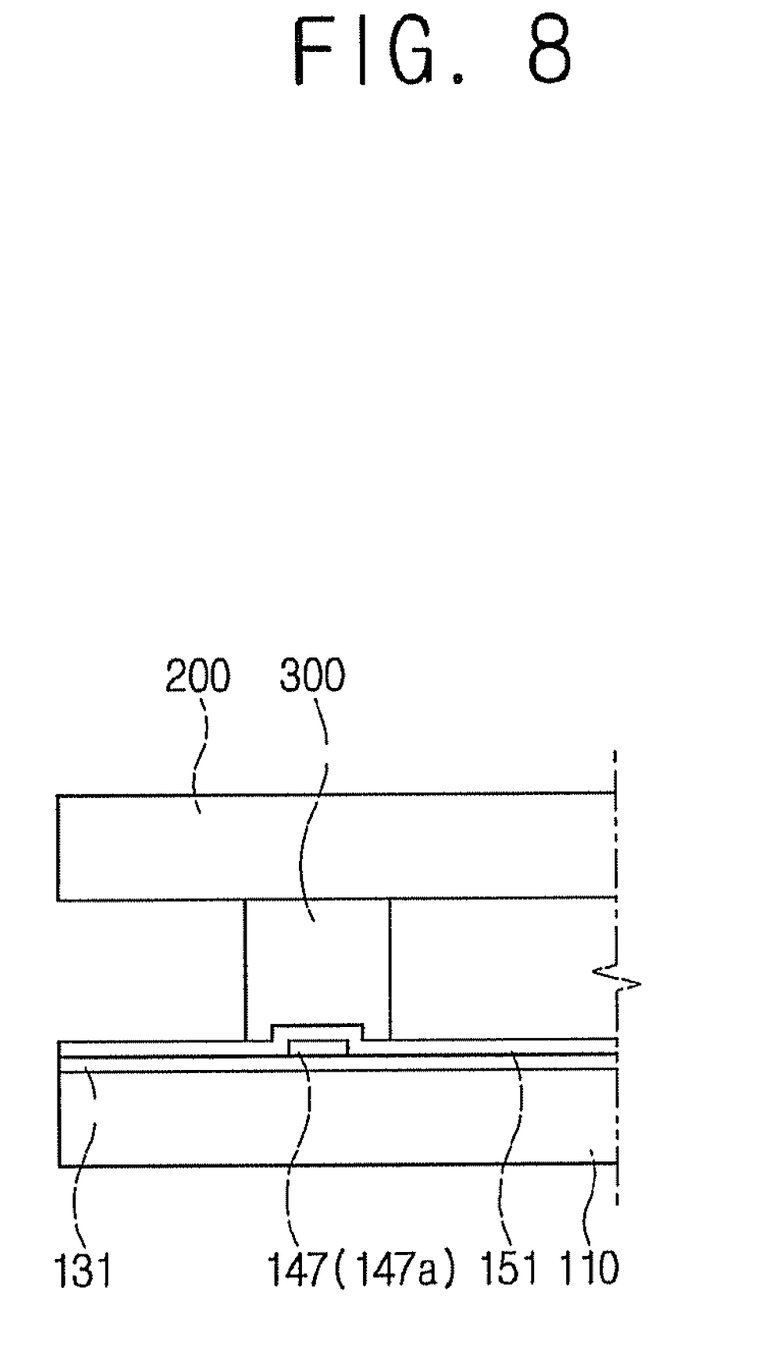
FIG. 8 is an enlarged view of portion 'D' in FIG. 4.

FIG. 8 shows the gate insulating layer 131 formed on the insulating substrate 110, and the first sub driving voltage transmitting part 147a formed on the gate insulating layer 131. The first sub driving voltage transmitting part 147a is disposed in the region occupied by the adhesion member 300 and the passivation layer 151 is layered between the first sub driving voltage transmitting part 147a and the adhesion member 300. As the first sub driving voltage transmitting part 147a and the driving voltage supplying part 146 may be formed in the same layer of the display device, the passivation layer 151 may also be layered between the driving voltage supplying part 146 and the adhesion member 300.

A second sub driving voltage transmitting part 147b is disposed and extended parallel or substantially parallel to the data line 141 on the non-display region right of the display region, namely, on the non-display region along a fourth edge 110d of the insulating substrate 110.

The second sub driving voltage transmitting part 147b formed in one body, such as integrally, with the driving voltage supplying part 146. As shown in FIGS. 2 and 3, an end portion 'C' of the second sub driving voltage transmitting part 147b is connected to the circuit board 402 through a driving voltage transmitting film 404. In the illustrated embodiment, a first driving voltage transmitting film 404 connects the circuit board 402 to the first sub driving voltage transmitting part 147a, and a second driving voltage transmitting film 404 connects the circuit board 402 to the second sub driving voltage transmitting part 147b.

The display device described thus far has the circuit board 402 attached along only one edge of the insulating substrate 110. In other words, the display device is not provided with an additional circuit board to drive the gate line 121 and to supply the common voltage. Accordingly, the display device according to the first exemplary embodiment has a relatively simple configuration.

Also in the exemplary embodiments, since the driving voltage supplying part 146 is disposed in the region occupied by the adhesion member 300, the driving voltage supplying part 146 does not occupy any other separate region. Most of the driving voltage supplying part 147 is also disposed in the region occupied by the adhesion member 300 and therefore also does not occupy any other separate region. The common voltage is supplied to the display unit without using any separate circuit board.

Accordingly, the display device according to the first exemplary embodiment supplies the common voltage and the driving voltage to the display unit without enlarging the non-display region and without an additional separate circuit board.

Figure 9:
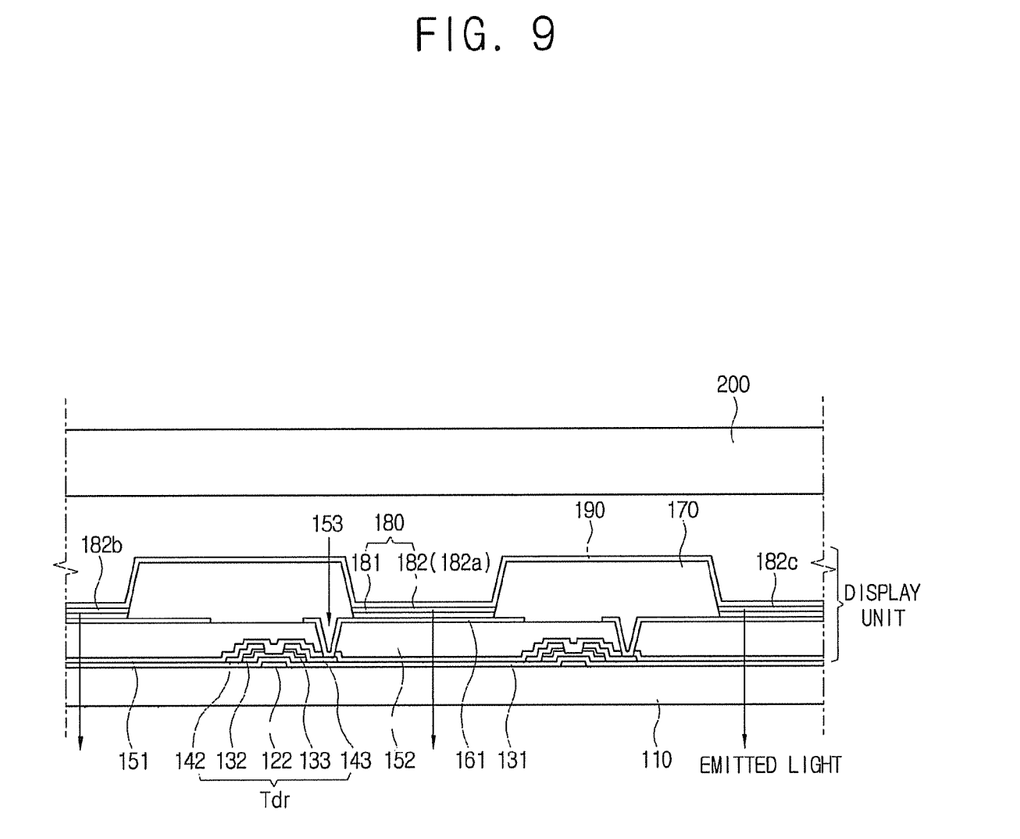
FIG. 9 is an enlarged view of portion 'E' in FIG. 4.

Next, the display region is described with reference to FIG. 9.

The gate line 121 and a gate electrode 122 are formed on the insulating substrate 110, the insulating substrate including insulating materials such as glass, quartz, ceramic, plastic, etc. Here, the gate line 121 is connected to the gate pad 124.

The gate insulating layer 131 including silicon nitride (SiNx), etc. is formed on the gate line 121 and the gate electrode 122, as well as on exposed areas of the insulating substrate 110.

A semiconductor layer 132 of amorphous silicon ("a-Si") and a resistive contact layer 133 of n+ hydrated a-Si doped with n type impurity are formed consecutively on a portion of the gate insulating layer 110 covering the gate electrode 122. Here, the resistive contact layer 133 is separated as two parts with the gate electrode 122 as their center.

A source electrode 142 and a drain electrode 143 are formed on the resistive contact layer 133 and the gate insulating layer 131. The source electrode 142 and the drain electrode 143 are disposed with the gate electrode 122 as their center.

The passivation layer 151 is formed on the source electrode 142 and the drain electrode 143, and on an exposed portion of the semiconductor layer 132 that is not covered with the source electrode 142 and the drain electrode 143, as well as on exposed portions of the gate insulating layer 131. The passivation layer 151 may include SiNx.

A planarization layer 152 is formed on the passivation layer 151. The planarization layer 152 may include at least any one of benzocyclobutene ("BCB") group, olephin group, acrylic resin group, polyimide group, and fluoride resin group. The fluoride resin group includes polytetrafluoroethylene ("PTEF"), polyfluorocyclobutane ("PFCB"), florinated ethylene propylene ("FEP"), poly fluoroalchoxyc ("PFA"), ethylene tetra fluoro ethylene ("ETFE") and polyvinylidene fluoride ("PVDF"). The fluoride resin group further includes CYTOP having the following Formula 1 manufactured by Asahi Glass of Japan.

Formula 1

A pixel electrode 161 is formed on the planarization layer 152. The pixel electrode 161 supplies holes to an organic layer 180. The pixel electrode 161 includes transparent conductive materials like indium tin oxide ("ITO"), indium zinc oxide ("IZO"), etc. and is connected to the drain electrode 143 through a contact hole 153.

Contact members, such as contact member 162, in the non-display region are formed on a same layer of the display device on which the pixel electrode 161 is formed.

A partition wall 170 surrounding the pixel electrode 161 is formed on the pixel electrode 161 and the planarization layer 152. The partition wall 170 defines a pixel region by partitioning the pixel electrodes 161. The partition wall 170 prevents an electrical short of the source electrode 142 and the drain electrode 143 of the driving TFT Tdr with the common electrode 190. The partition wall 170 includes organic photosensitive materials having thermally stable and non-dissolving attributes such as acrylic resin, polyimide resin, or inorganic materials like SiO2 and TiO2, and may be formed as two layers of organic and inorganic layers.

The organic layer 180 is formed on the pixel electrode 161 and the organic layer 180 includes a hole injection layer 181 and a light emitting layer 182.

The hole injection layer 181 includes a mixture like polythiophene derivative of poly(3,4)ethylenedioxythiopene ("PEDOT"), etc. and polystyrenesulfonate ("PSS"), etc.

The light emitting layer 182 is formed in the pixel areas of the display device with a repeated pattern of red light emitting layers 182a, green light emitting layers 182c, and blue light emitting layers 182b.

The light emitting layer 182 may include polyfluorene derivative, (poly)paraphenylenevinylene derivative, polyphenylene derivative, polyvinylcarbazol, polythiophene derivative and polymers of these materials doped with pherylene group pigment, rhodamine group pigment, ruburene, perylene, 9,10-diphenlyanthrasene, tetraphenylbutadiene, nilered, coumarin 6, quina quridone.

The holes from the pixel electrode 161 and the electrons from the common electrode 190 are coupled to be excitons in the light emitting layer 182 and emit light through reactivation process of the excitons.

The common electrode 190 is disposed on the partition wall 170 and the light emitting layer 182. The common electrode 190 supplies electrons to the light emitting layer 182. The common electrode 190 may be layered with a fluoride lithium layer and an aluminum layer. If the common electrode 190 is formed with an opaque material like aluminum or silver, a light emitted from the light emitting layer 182 is emitted to the insulating substrate 110 below, as illustrated, which is called bottom emission type.

According to the first exemplary embodiment, the data driving part 401 is attached to the data pad 144 as a chip in a chip on glass ("COG") type of attachment. Alternatively, the data driving part 401 may be attached to a film and the film may be connected to the data pad 144. The gate driving part 124 may be provided as a chip mounted on the insulating substrate 110 instead of as a shift register. The gate driving part 124 may also be disposed outside of the adhesion member 300.

Without protection, the display device may be easily deteriorated by moisture and oxygen. Thus, the encapsulating substrate 200 and the adhesion member 300 prevent infiltration of moisture and oxygen to the organic layer 180. The encapsulating substrate 200 may include one of glass and stainless steel. The adhesion member 300 may include melamine resin, urea resin, phenol resin, resorcinol resin, epoxy resin, unsaturated polyesther resin, polyurethane resin, and acrylic resin but is not limited to the above materials. The adhesion member 300 may include an internal spacer to maintain a gap between the two substrates 110 and 200.

Figure 10:
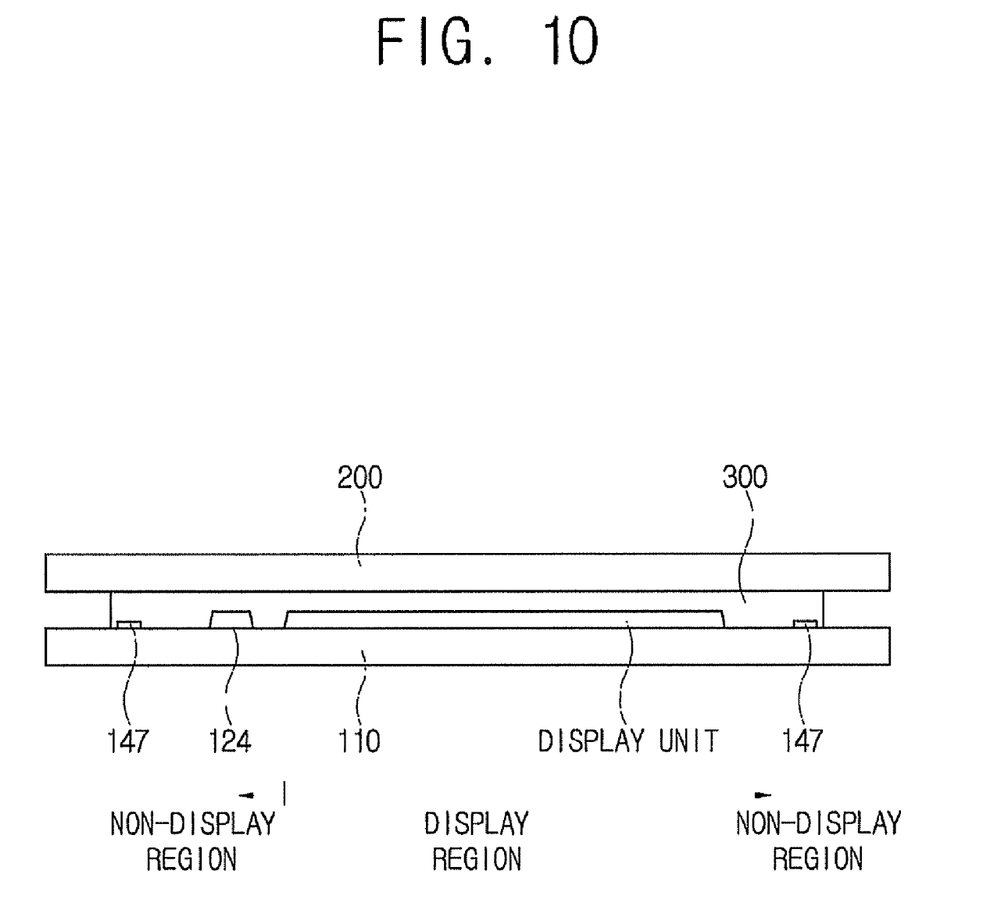
FIG. 10 is a cross sectional view of an exemplary display device according to a second exemplary embodiment of the present invention.

A second exemplary embodiment is described with reference to FIG. 10.

An adhesion member 300 is formed at least partially in the area of the non-display region as previously described, but is also formed on the display unit in the display region in the second exemplary embodiment. The adhesion member 300 may be formed on an encapsulating substrate 200 and/or on the display unit by coating. Methods of coating include spin coating, screen coating, slit coating, etc.

According to the second exemplary embodiment, a space between the encapsulating substrate 200 and the display unit is filled with the adhesion member 300 thereby enhancing a property by blocking moisture and oxygen more efficiently.

Figure 11:
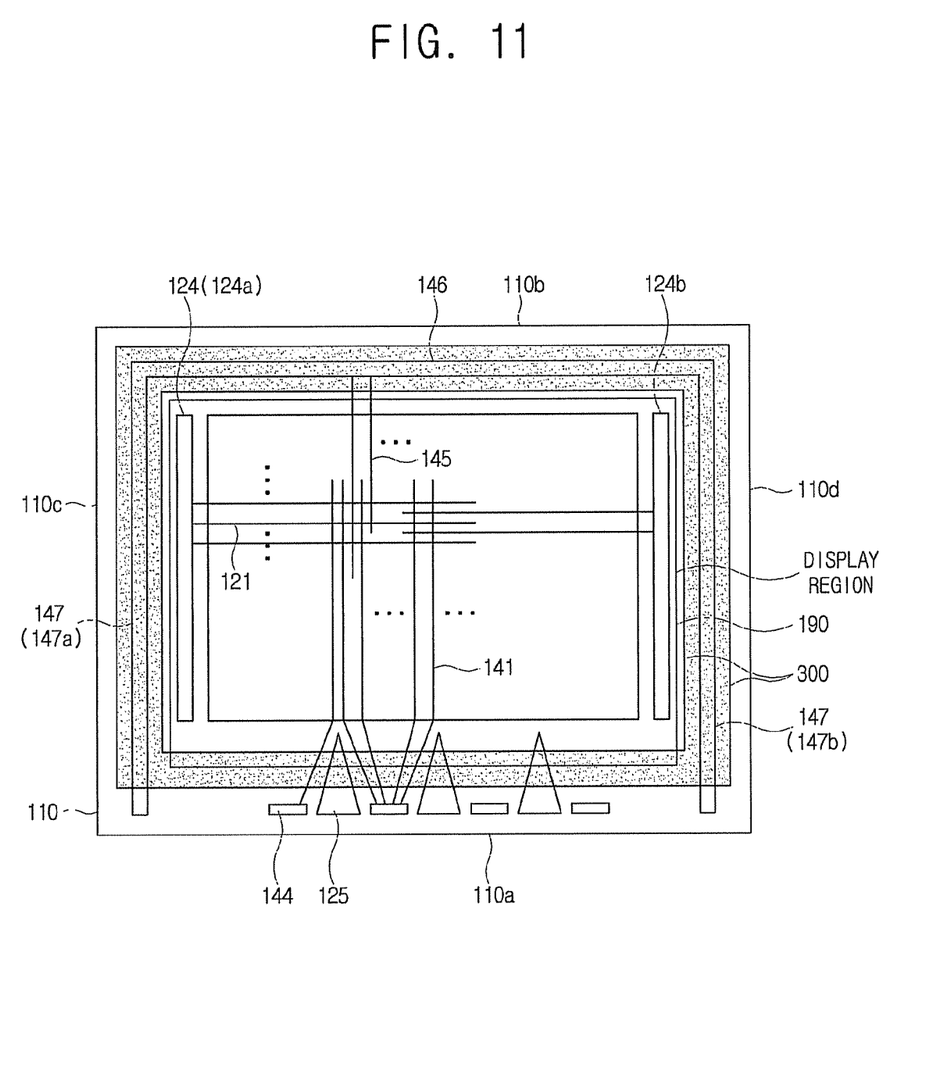
FIG. 11 shows a schematic top layout view of an exemplary display device according to a third exemplary embodiment of the present invention.

A third exemplary embodiment is described with reference to FIG. 11.

According to the third exemplary embodiment, a gate driving part 124 includes a first sub gate driving part 124a disposed left to a display region and a second sub gate driving part 124b disposed right to the display region.

The gate lines 121 are connected to the first sub gate driving part 124a and the second sub gate driving part 124b in turn. Without both first and second sub gate driving parts 124a and 124b, when an interval between the gate lines 121 is narrow, a gap in the gate driving part 124 connected to the gate lines 121 also becomes narrow and makes a formation of the gate driving part 124 difficult. However, according to the third exemplary embodiment, the gate driving part 124 is divided into the two parts 124a and 124b leading to an easy formation of the gate driving part 124.

Figure 12:
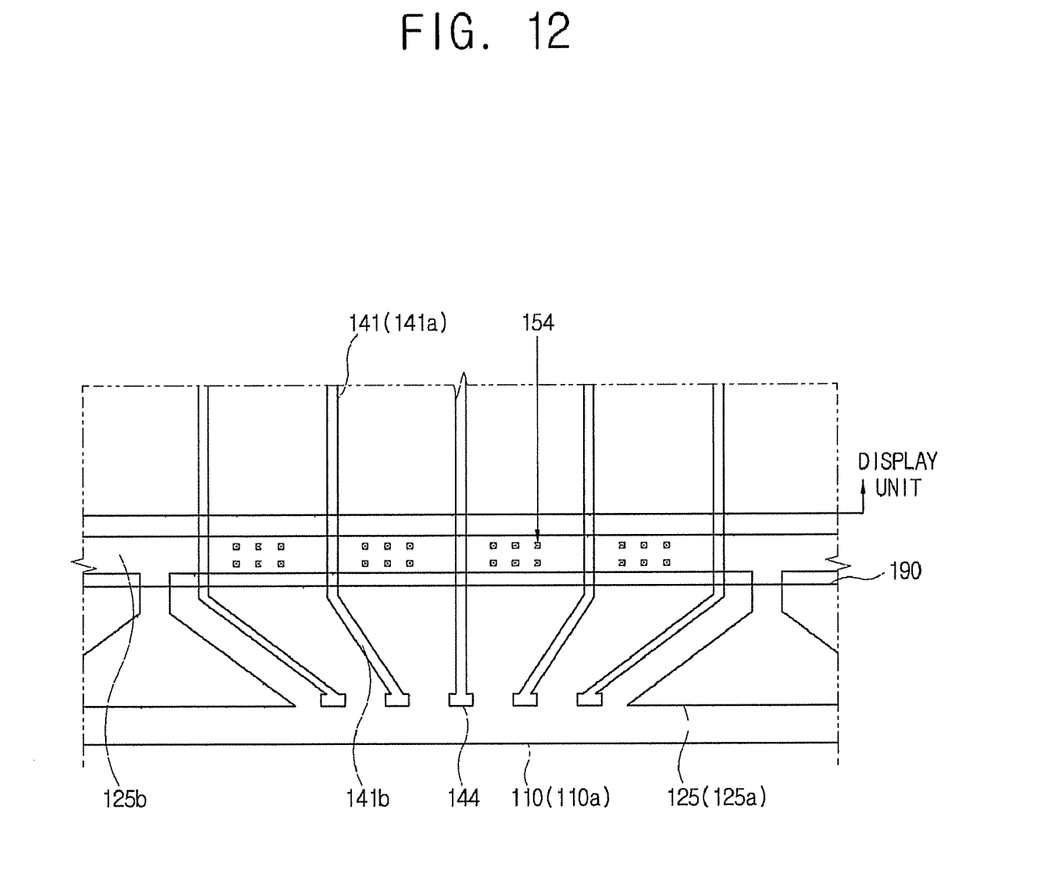
FIG. 12 shows a schematic top layout view of a key portion in an exemplary display device according to a fourth exemplary embodiment of the present invention.

A fourth exemplary embodiment is described with reference to FIG. 12. FIG. 12 corresponds to portion 'A' of FIG. 2.

A common voltage supplying part 125 includes a first part 125a disposed between adjacent groups of data pads 144 and a second part 125b extended in direction perpendicular or substantially perpendicular to a data line 141. The first part 125a and the second part 125b are formed in one body, such as integrally, but are formed on a layer of the display device different from a layer of the display device on which the data line 141 is formed.

The data line 141 includes a main part 141a, which is parallel to the other main parts 141a of other data lines 141, and a fan-out part 141b, which is not parallel to the other fan-out parts 141b of other data lines 141, and the fan-out part 141b extends to a data pad 144. The main part 141a is perpendicular or substantially perpendicular to the extended second part 125b of the common voltage supplying part 125.

The first part 125a receives a common voltage from a circuit board 402 through a common voltage transmitting film 403. A contact hole 154 is formed on the second part 125b connecting the second part 125b with a common electrode 190 electrically.

As apparent from the above description, the present invention provides a display device supplying a common voltage and a driving voltage without an increase of a non-display region. The present invention also provides a method of supplying a common voltage and a driving voltage to a display device without increasing a non-display region of the display device.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic light emitting device comprising an insulating substrate having a display region formed with a display unit and an encapsulating substrate facing the insulating substrate, the display device further comprising:
   a wire including a power supply line, a data line, and a gate line;
   a circuit board connected to a first edge of the insulating substrate, extending substantially parallel to the gate line, and the circuit board supplying a common voltage and a driving voltage to the display unit;
   a driving voltage supplying part provided between a second edge of the insulating substrate, opposite to the first edge, and the display region, and the driving voltage supplying part connected to the power supply line;
   a driving voltage transmitting part formed along a periphery of the display region, connected to the circuit board through one side thereof and connected to the driving voltage supplying part through another side thereof; and
   a common voltage supplying part formed between the circuit board and the display region, the common voltage supplying part supplying the common voltage from the circuit board to the display unit,
   wherein the display region is disposed between the driving voltage supplying part and the common voltage supplying part.

2. The organic light emitting device according to claim 1 further comprising an adhesion member disposed between the insulating substrate and the encapsulating substrate, wherein at least a portion of the driving voltage transmitting part and at least a portion of the driving voltage supplying part are disposed between the adhesion member and the insulating substrate.

3. The organic light emitting device according to claim 2, wherein at least a portion of the adhesion member is formed along the periphery of the display region.

4. The organic light emitting device according to claim 3, wherein the adhesion member is extended over the display unit.

5. The organic light emitting device according to claim 2 further comprising a gate driving part connected to the gate line and attached to the insulating substrate outside of a region occupied by the adhesion member.

6. The organic light emitting device according to claim 1, wherein the driving voltage transmitting part includes a first sub driving voltage transmitting part adjacent one side of the display region and a second sub driving voltage transmitting part adjacent an opposite side of the display region, leaving the display region disposed between the first sub driving voltage transmitting part and the second sub driving voltage transmitting part.

7. The organic light emitting device according to claim 1, wherein the driving voltage transmitting part and the driving voltage supplying part are integrally formed.

8. The organic light emitting device according to claim 1, wherein the driving voltage transmitting part and the driving voltage supplying part are formed on a same layer of the display device.

9. The organic light emitting device according to claim 1, wherein the common voltage supplying part and the gate line are formed on a same layer of the display device.

10. The organic light emitting device according to claim 9, wherein at least a portion of the common voltage supplying part is extended lengthwise to cross the data line.

11. The organic light emitting device according to claim 1, further comprising a gate driving part connected to the gate line, wherein at least a portion of the gate driving part is disposed between the driving voltage transmitting part and the display region.

12. The organic light emitting device according to claim 11, further comprising a plurality of gate lines, wherein the gate driving part comprises a first sub gate driving part connected with a first set of the gate lines and a second sub gate driving part connected with a remaining set of the gate lines, wherein the first sub gate driving part and the second sub gate driving part are provided adjacent opposite sides of the display region, leaving the display region disposed between the first sub gate driving part and the second sub gate driving part.

13. The organic light emitting device according to claim 11, wherein the gate driving part is formed on the insulating substrate.

14. The organic light emitting device according to claim 1 further comprising a data driving part attached to the insulating substrate between the display region and the first edge of the insulating substrate.

15. The organic light emitting device according to claim 1, wherein the encapsulating substrate comprises one of glass and stainless steel.

16. The organic light emitting device according to claim 1, wherein the display unit comprises a common electrode, a portion of the common electrode overlapping the common voltage supplying part.

17. An organic light emitting device comprising an insulating substrate having a display region formed with a display unit and an encapsulating substrate facing the insulating substrate, the display device comprising: a circuit board connected to the insulating substrate and supplying a driving signal, a common voltage, and a driving voltage to the display unit; a common voltage supplying part disposed adjacent to the circuit board and supplying the common voltage from the circuit board to the display unit; and a driving voltage supplying part facing the common voltage supplying part and supplying the driving voltage from the circuit board to the display unit, the display region disposed between the driving voltage supplying part and the common voltage supplying part.

18. The organic light emitting device according to claim 17, further comprising an adhesion member disposed between the insulating substrate and the encapsulating substrate, wherein at least a portion of the driving voltage supplying part is disposed between the adhesion member and the insulating substrate.

19. The organic light emitting device according to claim 17, wherein the display unit comprises a common electrode, a portion of the common electrode overlapping the common voltage supplying part.

20. A method of limiting an area of a non-display region of an organic light emitting device while supplying a common voltage and a driving voltage to the display device, the display device having an insulating substrate having a display region formed with a display unit, the method comprising: providing a common voltage supplying part on the insulating substrate adjacent a first side of the display region, the common voltage supplying part supplying the common voltage to the display unit; and, providing a driving voltage supplying part on the insulating substrate adjacent a second side of the display region, the second side opposite the first side, the driving voltage supplying part supplying the driving voltage to the display unit; wherein the display region is disposed between the common voltage supplying part and the driving voltage supplying part.

21. The method according to claim 20, wherein the organic light emitting device further includes an encapsulating substrate facing the insulating substrate, the method further comprising disposing an adhesion member between the insulating substrate and the encapsulating substrate and at least partially covering the driving voltage supplying part with the adhesion member.

22. The method according to claim 20, further comprising connecting a first end of a driving voltage transmitting part to the driving voltage supplying part, and connecting a second end of the driving voltage transmitting part to a circuit board disposed adjacent the first side of the display region, wherein the circuit board provides the common voltage to the common voltage supplying part and provides the driving voltage to the driving voltage supplying part.

23. The method according to claim 20, wherein the display unit comprises a common electrode, a portion of the common electrode overlapping the common voltage supplying part.

* * * * *